(12) United States Patent
Yamazaki

(10) Patent No.: US 6,809,393 B1
(45) Date of Patent: Oct. 26, 2004

(54) LEVEL SHIFTER

(75) Inventor: Tomoyuki Yamazaki, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/539,145

(22) Filed: Mar. 30, 2000

(30) Foreign Application Priority Data

Mar. 31, 1999 (JP) ............................................. 11-093468

(51) Int. Cl.[7] .......................... H01L 23/58; H01L 23/62
(52) U.S. Cl. ........................ 257/493; 257/358; 257/492
(58) Field of Search ................................. 257/328, 358, 257/360, 379, 380, 491, 492, 493, 494, 495, 496, 541, 537, 538, 536, 543, 542

(56) References Cited

U.S. PATENT DOCUMENTS

| | | | | |
|---|---|---|---|---|
| 3,885,998 A | * | 5/1975 | Reindl | 148/175 |
| 4,760,434 A | * | 7/1988 | Tsuzuki et al. | 357/23.13 |
| 5,801,418 A | * | 9/1998 | Ranjan | 257/336 |
| 5,917,341 A | * | 6/1999 | Suder et al. | 326/84 |
| 6,087,899 A | * | 7/2000 | Kubota | 307/310 |
| 6,096,591 A | * | 8/2000 | Gardner et al. | 438/238 |

FOREIGN PATENT DOCUMENTS

| | | | | |
|---|---|---|---|---|
| JP | 404208517 A | * | 7/1992 | .......... H01L/21/04 |
| JP | 9-55498 | | 2/1997 | |

OTHER PUBLICATIONS

Carter, D.R.H. et al, "An integrated level shifter for use in high frequency half–bridges" in "New Deleopments in Power Semiuconductor Devices", IEE Colloquium on—(Digest #1996/046), pp. 9/1–9/8, Jun. 21, 1996.*

* cited by examiner

Primary Examiner—Nathan J. Flynn
Assistant Examiner—Johannes Mondt
(74) Attorney, Agent, or Firm—Rossi & Associates

(57) ABSTRACT

A level shifter is provided that facilitates reducing high-bias-voltage application to a MOSFET and improving the reliability thereof. The level shifter includes an NMOSFET formed of a first isolated region in the surface portion of a P-type substrate, a source, a channel and a drain in the surface portion of a first isolated region, and a gate above the first isolated region; a second isolated region in the surface portion of P-type substrate and space apart from first isolated region; and high-potential portions including pinch resistance with a high breakdown voltage in second isolated region.

13 Claims, 8 Drawing Sheets

LEVEL SHIFTER

FIELD OF THE INVENTION

The present invention relates to a level shifter used for controlling and for driving power devices. More specifically, the present invention relates to a level shifter formed on a semiconductor substrate.

BACKGROUND

The requirements for the electric power converters, such as inverters which use power switching devices, include low electric power consumption, high performances, small size, low costs, low noise and such requirements. In the field of power modules developed by combining an insulated gate bipolar transistor (IGBT) and a free wheel diode (FWD), intelligent power modules (IPM's) have been used widely. The IPM incorporates a microcomputer, that mounts intelligent functions, e.g. for detecting and protecting against overcurrent and overheat and that programs the operations of the inverter, and an interface component for the power module. As a result, down-sizing of the inverters has progressed. However, since the IPM now incorporates the detector circuit and the protection circuit, that used to be configured outside the power module, in the power module, the number of the constituent parts, and the size and the manufacturing costs of the IPM are increased.

To obviate the problems described above, a driver IC with a high breakdown voltage (high-breakdown-voltage driver IC), that mounts the driver functions of the upper and lower arms of an inverter and various protection functions on one or more silicon chips, has been proposed. This IC has a structure that facilitates sustaining a high voltage of 600 V or 1200 V, that is the breakdown voltage of the IGBT. The high-breakdown-voltage driver IC includes a circuit, the reference potential thereof is the ground potential or a low potential close to the ground potential, and a circuit, the reference potential thereof is a high potential corresponding to the DC intermediate potential of the inverter. Therefore, it is necessary for the high-breakdown-voltage driver IC to include a level shifter with a high breakdown voltage (high-breakdown-voltage level shifter) for transmitting signals between the circuits.

FIG. 10 is a cross sectional view showing the structure of a conventional N-channel level shifter. Referring now to FIG. 10, an N-channel level shifter is formed on a substrate. The N-channel level shifter includes an N$^-$-type region 105 formed in the surface portion of a P$^-$-type substrate 106 for separating a high-breakdown-voltage portion by a reverse bias voltage across the PN-junction. The N-channel level shifter employs a double reduced surface electric field structure (double RESURF structure), including P$^-$-type substrate 106 and based on the principle of reduced surface electric field (RESURF), for relaxing the electric field around the curbed portion of the PN-junction. This structure of the N-channel level shifter raises the breakdown voltage closely to the breakdown voltage of the junction between P- and N-type parallel plates.

Sources 102b and 102c are formed in the surface portion of N-type region 105, that is connected electrically to a drain 104a, and a gate 102a is arranged above sources 102b and 102c such that an NMOSFET with a high breakdown voltage is constructed. Pinch resistance 103 with a high breakdown voltage is created in N$^-$-type region 105. Drain 104a works as a lead out terminal on the high potential side of pinch resistance 103. Drain 104a is connected electrically to a level shift resistor 101 arranged above N-type region 105.

In FIG. 10, level shift resistor 101 is on the same substrate on which the NMOSFET is formed. Alternatively, a double chip configuration may be employed that mounts level shift resistor 101 on another chip and connects level shift resistor 101 electrically to drain 104a by wiring.

FIG. 11 is a cross sectional view showing the structure of a conventional P-channel level shifter. The conventional P-channel level shifter employs a double RESURF structure in the same way as in the conventional N-channel level shifter of FIG. 10. Referring now to FIG. 11, a PMOSFET with a high breakdown voltage includes N-type regions 114 and 118 in the surface portion of a P-type substrate 1116, a drain 111b in the surface portion of N-type region 118, a P$^-$-type region 119 in the surface portion of N$^-$-type region 118 and connected to drain 111b, a source 111c in the surface portion of N$^-$-type region 118, and a gate 111a above N$^-$-type region 118. A level shift resistor 112 is arranged above N$^-$-type region 114. Level shift resistor 112 is connected electrically to drain 111b by a wire 120b. High-breakdown-voltage pinch resistance 113 is created in P$^-$-type region 119. Alternatively, level shift resistor 112 is formed on another chip as in the alternative of FIG. 10 and connected electrically to the MOSFET by wire bonding.

The conventional level shifters are not so reliable. A high bias voltage applied to the MOSFET under the high temperature and high humidity conditions lowers the threshold value of the MOSFET, that further lowers the breakdown voltage of the level shifter.

In view of the foregoing, it is an object of the invention to provide a level shifter that facilitates reducing high-bias-voltage application to the MOSFET and, thereby, improving the reliability thereof.

SUMMARY OF THE INVENTION

According to an aspect of the present invention, there is provided a level shifter, formed on a semiconductor substrate, for controlling and driving a power device, the level shifter including: a level shift resistor connected electrically to an intermediate potential circuit; a pinch resistance region exhibiting a high breakdown voltage, the pinch resistance region being connected electrically to the level shift resistor; and a field effect transistor region connected electrically to the pinch resistance region, the field effect transistor region being in a location not in contact with the level shift resistor nor with the pinch resistance region.

A high bias voltage is prevented from being applied to the field effect transistor region by connecting electrically the level shift resistor to the intermediate potential circuit, by connecting electrically the pinch resistance region to the level shift resistor, by connecting electrically the field effect transistor region to the pinch resistance region, and by positioning the field effect transistor region in a location not in contact with the level shift resistor nor with the pinch resistance region.

DETAILED DESCRIPTION OF THE PREFERRED EMBODIMENTS OF THE INVENTION

Now the invention will be explained hereinafter with reference to the accompanied drawing figures which illustrate the preferred embodiments of the invention.

Figure 2:
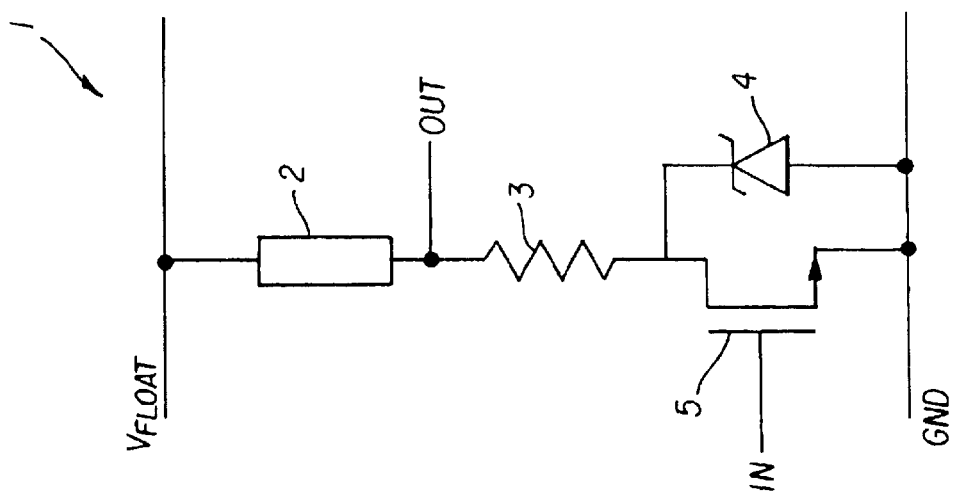
FIG. 2 is an equivalent circuit of the level shifter according to the first embodiment of the invention.

FIG. 2 is an equivalent circuit of a level shifter according to a first embodiment of the invention. Referring now to FIG. 2, the level shifter according to the first embodiment of the invention is an N-channel level shifter. The N-channel level shifter 1 includes a level shift resistor 2, pinch resistance with a high breakdown voltage (high-breakdown-voltage pinch resistance) 3, a protection diode 4 and an NMOSFET 5. An end of level shift resistor 2 is connected electrically to a $V_{float}$ potential circuit, the reference potential thereof is a DC intermediate potential and the other end of level shift resistor 2 to an OUT-terminal and high-breakdown-voltage pinch resistance 3. High-breakdown-voltage pinch resistance 3 is connected electrically to the drain of NMOSFET 5 and the cathode of protection diode 4. The source of NMOSFET 5 and the anode of protection diode 4 are connected to the ground GND. A Zener diode, the breakdown voltage thereof is lower than that of NMOSFET 5, is used for protection diode 4 so that NMOSFET 5 may be protected from an over voltage applied thereto.

Figure 1:
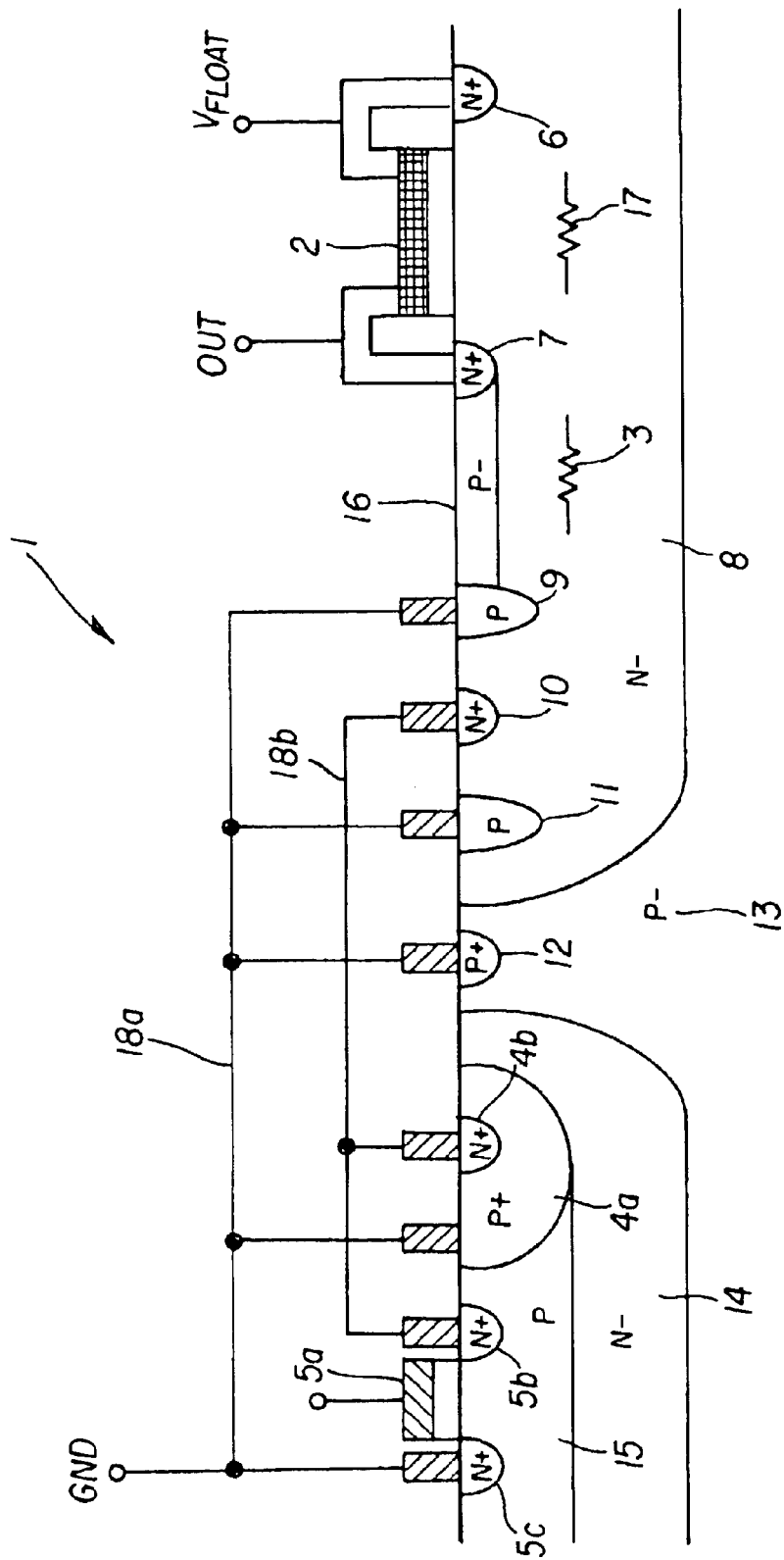
FIG. 1 is a cross sectional view showing the structure of a level shifter according to a first embodiment of the invention.

FIG. 1 is a cross sectional view showing the structure of the level shifter according to the first embodiment of the invention. Referring now to FIG. 1, the level shifter 1 includes a first isolated region 14 in the surface portion of a P-type substrate 13, a second isolated region 8 in the surface portion of P-type substrate 13, a channel 15, a source 5c, a drain 5b, an anode 4a of protection diode 4, a cathode 4b of protection diode 4, a P⁺-type region 12, P-type regions 9 and 11, P⁻-type region 16, N⁺-type regions 6, 7 and 10, wires 18a and 18b, a gate 5a, and a level shift resistor 2.

When a level shifter with a high breakdown voltage of the 600 V class is assumed, p-type substrate 13, the resistivity thereof is around 100 Ωcm, is used. First and second isolated regions 14 and 8 are formed in the surface portion of p-type substrate 13 by N⁻-diffusion at the charge amount of from 1×10¹² to 1×10¹³ cm⁻². In the surface portion of first isolated region 14, P-type channel 15 is formed. N⁺-type source 5c and N⁻-type drain 5b are formed in the surface portion of channel 15 by doping. Gate 5a is disposed above channel 15 with an oxide insulation film interposed therebetween. N⁻-type source 5c, N⁺-type drain 5b, channel 15 and gate 5a constitute NMOSFET 5. Here, it is assumed that NMOSFET 5 exhibits a breakdown voltage almost the same with the breakdown voltage of a MOSFET for configuring a CMOS logic circuit. Anode 4a of the protection diode is formed in the surface portion of first isolated region 14 and cathode 4b of the protection diode is formed in the surface portion of anode 4a, thereby to form protection diode 4. Protection diode 4 prevents a voltage higher than the breakdown voltage of NMOSFET 5 from being applied thereto.

High-breakdown-voltage pinch resistance 3 and parasitic resistance 7 are created inside second isolated region 8. N⁺-type regions 6, 7 and 10, and p-type regions 9 and 11 are formed in the surface portion of second isolated region 8 for leading out the pinch resistance. P⁻-type region 16 is formed in the surface portion of second isolated region 8 between P-type region 9 and N⁻-type region 7 for securing the breakdown voltage of P-type region 9 and N⁺-type region 7. Since P⁻-type region 16, second isolated region 8 and P-type substrate 13 constitute a double REFSURF structure, the electric field localizes to P-type region 9 or N⁺-type region 7 depending on the respective doping concentrations in P⁻-type region 16, second isolated region 8 and P-type substrate 13. As a result, a desired breakdown voltage will not be obtained. As a reference, the charge amount of $5 \times 10^{12}$ cm⁻² and the diffusion depth of from 1 to 2 μm are suitable for P-type region 16.

P⁺-type region 12 is formed in the surface portion of P-type substrate 13 for connecting to a GND terminal. P⁺-type region 12 is connected electrically to the GND terminal via a wire 18a. The GND terminal is connected electrically to source 5c, anode 4a of the protection diode, P-type region 9 and P-type region 11 via wire 18a. Source 5c is connected electrically to anode 4a, P-type region 9 and P-type region 11 via wire 18a. Drain 5b is connected electrically to cathode 4b of the protection diode and N⁺-type region 10 via wire 18b.

Level shift resistor 12 formed of a conductive film is disposed above second isolated region 8. An end of level shift resistor 12 is connected to N⁺-type region 7 and the OUT terminal. Another end of level shift resistor 12 is connected to N⁺-type region 6 and $V_{float}$.

Since the $V_{float}$ is connected also to second isolated region 8 via N⁺-type region 6 and since the $V_{float}$ works also as the power supply potential of a CMOS circuit formed between the $V_{float}$ and the DC intermediate potential, parasitic resistance 17 exits between N⁺-type regions 7 and 6. Parasitic resistance 17 is connected in parallel to level shift resistor 2. To make the above described configuration work as a level shifter, the resistance value of parasitic resistance 17 should be much higher than the resistance value of level shift resistor 2.

The level shifter according to the first embodiment includes first isolated region 14 in the surface portion of P-type substrate 13, and second isolated region 8 in the surface portion of P-type substrate 13 and spaced apart from first isolated region 14. The NMOSFET 5 is formed of source 5c, channel 15 and drain 5b in first isolated region 14 and gate 5a above first isolated region 14. The high-potential portions including high-breakdown-voltage pinch resistance 3 are arranged in second isolated region 8. The high-potential portions are connected to NMOSFET 5 by wires 18a and 18b. This configuration facilitates reducing highbias-voltage application to NMOSFET 5 affected by the high-potential portions including high-breakdown-voltage pinch resistance 3 and, therefore, improving the long-term reliability of the level shifter.

In the level shifter according to the first embodiment, level shift resistor 2 is formed of a conductive film arranged above second isolated region 8. Alternatively, level shift resistor 2 may be formed by P-diffusion in the surface portion of second isolated region 8, or by P-diffusion in the surface portion of second isolated region 8 and subsequent $N^+$-diffusion in the P-type diffusion region.

According to the first embodiment, level shift resistor 2 and NMOSFET 5 are formed on the same substrate. Alternatively, level shift resistor 2 and NMOSFET 5 may be formed on the respective substrates. In this alternative configuration, level shift resistor 2 is connected to $N^-$-type region 7 by wire bonding.

In the level shifter according to the first embodiment, protection diode 4 is connected in opposite parallel to NMOSFET 5 to protect NMOSFET 5. When an NMOSFET with a high breakdown voltage is used, protection diode 4 may be omitted.

Figure 3:
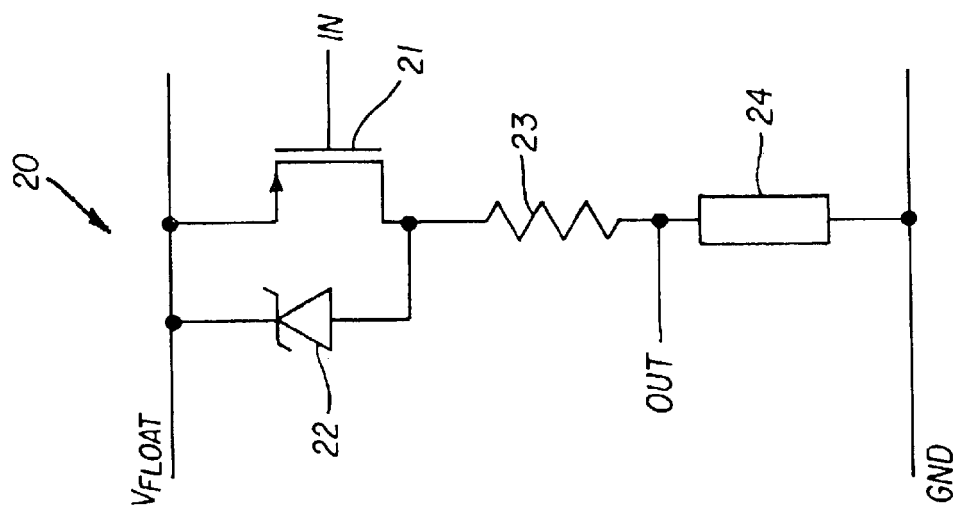
FIG. 3 is an equivalent circuit of a level shifter according to a second embodiment of the invention.

Now, the level shifter according to a second embodiment will be explained hereinafter with reference to FIGS. 3 and 4. FIG. 3 is an equivalent circuit of the level shifter according to the second embodiment of the invention. Referring now to FIG. 3, the level shifter according to the second embodiment of the invention is a P-channel level shifter. The P-channel level shifter 20 includes a level shift resistor 24, pinch resistance with a high breakdown voltage (high-breakdown-voltage pinch resistance) 23, a protection diode 22 and a PMOSFET 21. An end of level shift resistor 24 is connected electrically to the ground GND, and another end of level shift resistor 24 to an OUT terminal and pinch resistance 23. Pinch resistance 23 is connected electrically to the anode of protection diode 22 and the drain of PMOSFET 21. The source of PMOSFET 21 and the cathode of protection diode 22 are connected electrically to a $V_{float}$ potential circuit, the reference potential thereof is a DC intermediate potential. A Zener diode, the breakdown voltage thereof is lower than that of PMOSFET 21, is used for protection diode 22 so that PMOSFET 21 may be protected from an over voltage applied thereto.

Figure 4:
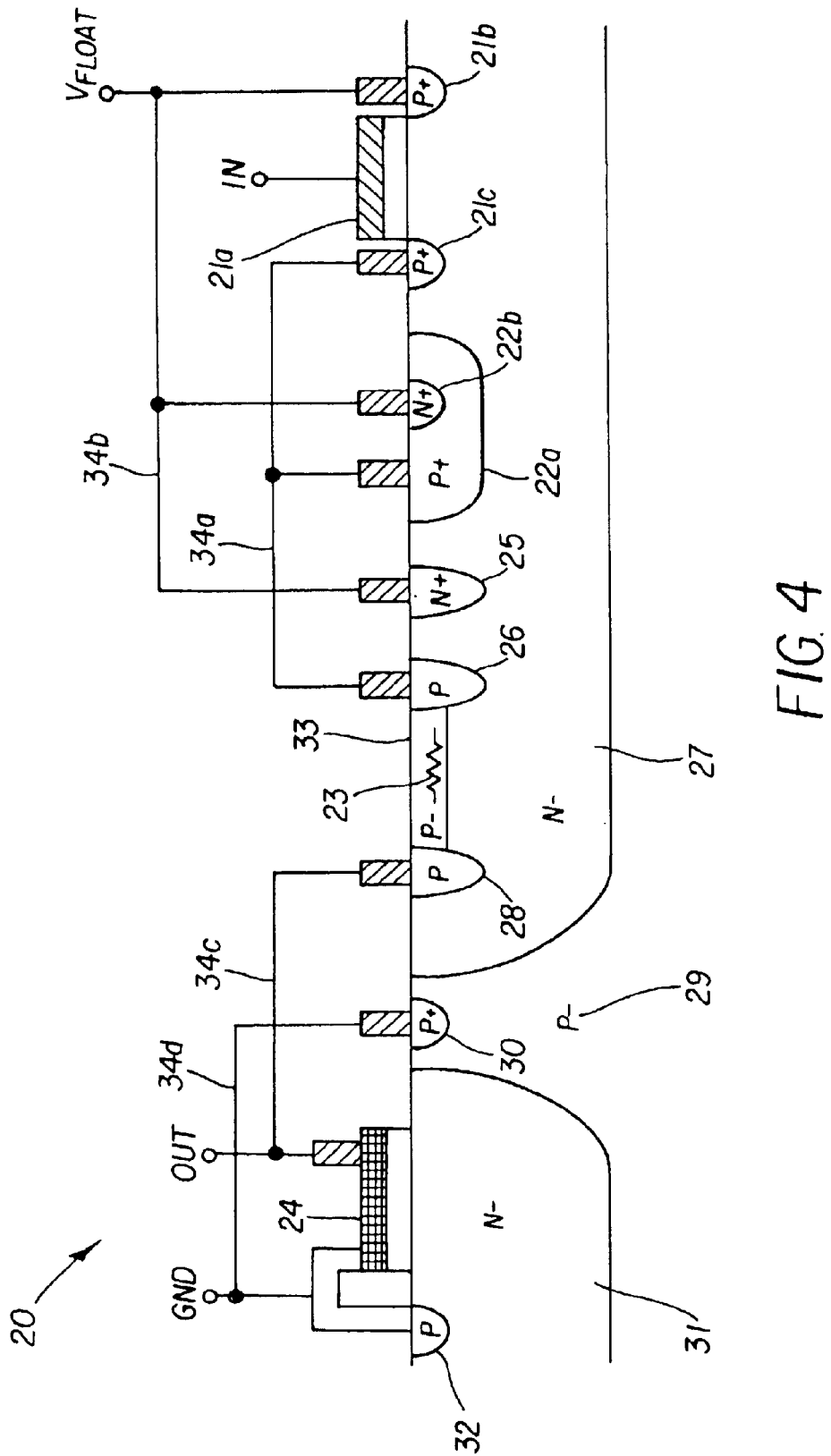
FIG. 4 is a cross sectional view showing the structure of the level shifter according to the second embodiment of the invention.

FIG. 4 is a cross sectional view showing the structure of the level shifter according to the second embodiment of the invention. Referring now to FIG. 4, the level shifter 20 includes a P-type substrate 29, a first isolated region 31 in the surface portion of P-type substrate 29, a second isolated region 27 in the surface portion of P-type substrate 29, a source 21b, a drain 21c, an anode 22a of protection diode 22, a cathode 22b of protection diode 22, an $N^+$-type region 25, a P-type region 26, a P-type region 28, a P—type region 33, a P-type region 32, and a $P^+$-type region 30. Level shifter 20 includes also wires 34a, 34b, 34c and 34d, a gate 21a and a level shift resistor 24 arranged above substrate 29.

$N^-$-type first isolated region 31 and $N^-$-type second isolated region 27 independent from each other are formed by $N^+$-diffusion in the surface portion of P-type substrate 29. $P^+$-type source 21b and $P^-$-type drain 21c are formed in the surface portion of second isolated region 27 by doping. Gate 21a is arranged above the extended portion of second isolated region 27 extended between source 21b and drain 21c with an oxide insulation film interposed therebetween. $N^-$-type second isolated region 27, $P^+$-type source 21b, $P^+$-type drain 21c, and gate 21a constitute PMOSFET 21. Protection diode 22 is formed of $P^-$-type anode 22a in the surface portion of second isolated region 27 and $N^+$-type cathode 22b in the surface portion of $P^+$-type anode 22a. $N^-$-type region 25, P-type region 26, p-type region 28 and $P^-$-type region 33 are formed in the surface portion of second isolated region 27 away from drain 21c with anode 22a of protection diode 22 interposed therebetween. P-type region 26 is connected to P-type region 28 via P—type region 33. High-breakdown-voltage pinch resistance 23 is created in $P^-$-type region 33. A P-type terminal 28 works as a lead out terminal on the low potential side of high-breakdown-voltage pinch resistance 23 and a P-type terminal 26 as a lead out terminal on the high potential side of high-breakdown-voltage pinch resistance 23.

Level shift resistor 24 formed of a conductive film is disposed above first isolated region 31. Level shift resistor 24 is connected electrically to P-type region 32 in the surface portion of first isolated region 31.

$P^+$-type region 30 is formed in the surface portion of P-type substrate 29 for connecting to a GND terminal. $P^+$-type region 30 is connected electrically to the GND terminal and level shift resistor 24 via wire 34d. Level shift resistor 24 is connected electrically via wire 34c to an OUT terminal and P-type region 28 for leading out high-breakdown-voltage pinch resistance 23. P-type region 26 is connected electrically to anode 22a of protection diode 22 and drain 21c via wire 34a. $N^+$-type region 25 is connected electrically to cathode 22b of protection diode 22 and source 21b via wire 34b. Wire 34b is connected electrically to the $V_{float}$ potential circuit, the reference potential thereof is the DC intermediate potential.

The level shifter according to the second embodiment arranges $P^-$-type region 33 away from drain 21c with anode 22a of protection diode 22 interposed therebetween and electrically connects p-type region 26 connected to $P^-$-type region 33 as a lead out terminal on the high potential side of pinch resistance 23 to drain 21c via wire 34a. This configuration facilitates reducing high-bias-voltage application to PMOSFET 21 affected by the high-potential portions including high-breakdown-voltage pinch resistance 23 and, therefore, improving the long-term reliability of the level shifter.

In the level shifter according to the second embodiment, level shift resistor 24 is formed of a conductive film arranged above first isolated region 31. Alternatively, level shift resistor 24 may be formed by P-diffusion in the surface portion of first isolated region 31, or by P-diffusion in the surface portion of first isolated region 31 and subsequent $N^+$-diffusion in the P-type diffusion region.

According to the second embodiment, level shift resistor 24 and PMOSFET 21 are formed on the same substrate. Alternatively, level shift resistor 24 and PMOSFET 21 may be formed on the respective substrates. In this alternative configuration, level shift resistor 24 is connected to P-type region 32 by wire bonding.

In the level shifter according to the second embodiment, protection diode 22 is connected in opposite parallel to PMOSFET 21 to protect PMOSFET 21. When a PMOSFET with a high breakdown voltage is used, protection diode 22 may be omitted.

Now, the level shifter according to a third embodiment will be explained hereinafter with reference to FIG. 5. The level shifter according to the third embodiment includes a modified pinch resistance portion with a high breakdown voltage (high-breakdown-voltage pinch resistance portion). The level shifter according to the third embodiment has the same configuration with that of the level shifter according to the first embodiment except the high-breakdown-voltage pinch resistance portion.

Figure 5:
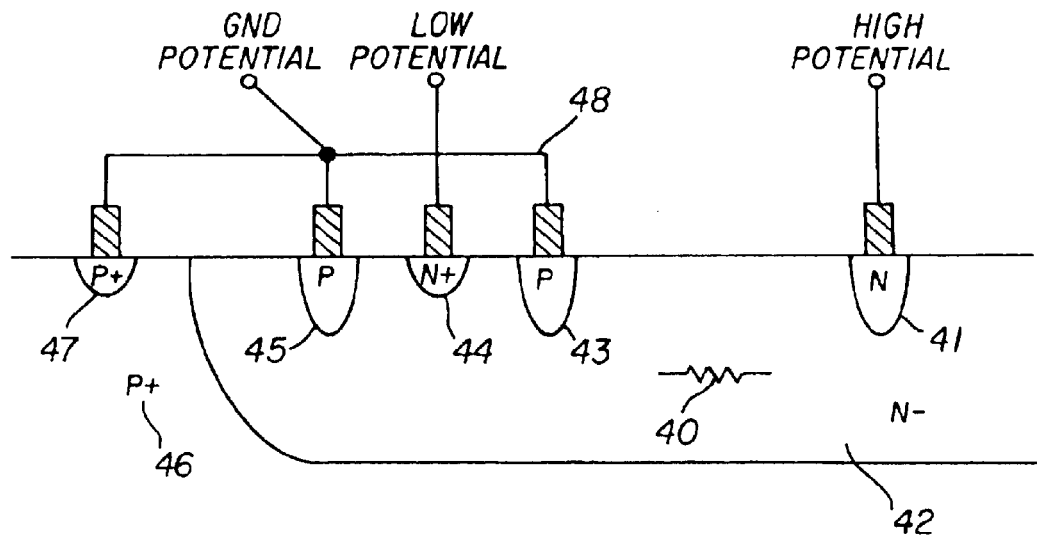
FIG. 5 is a cross sectional view showing the pinch resistance portion with a high breakdown voltage of the level shifter according to the third embodiment of the invention.

FIG. 5 is a cross sectional view showing the pinch resistance portion with a high breakdown voltage of the level shifter according to the third embodiment of the invention. Referring now to FIG. 5, the high-breakdown-voltage pinch resistance portion according to the third embodiment has a single RESURF structure, that omits $P^-$-type region 16 from the high-breakdown-voltage pinch resistance portion according to the first embodiment. An $N^-$-type isolated region 42 is formed by doping in the surface portion of a P-type substrate 46. A P-type region 45, a P-type region 43, an $N^+$-type region 44 and an N-type region 41 are formed in the surface portion of $N^-$-type isolated region 42. A $P^+$-type region 47 is formed in the surface portion of P-type substrate 46 for connecting to a GND terminal. $P^+$-type region 47 is connected to P-type regions 43 and 45 via a wire 48. A high-breakdown-voltage pinch resistance 40 is created in $N^-$-type isolated region 42. $N^{-1}$-type region 44 works as a lead out terminal on the low potential side of high-breakdown-voltage pinch resistance 40. N-type region 41 works as a lead out terminal on the high potential side of high-breakdown-voltage pinch resistance 40.

Figure 6:
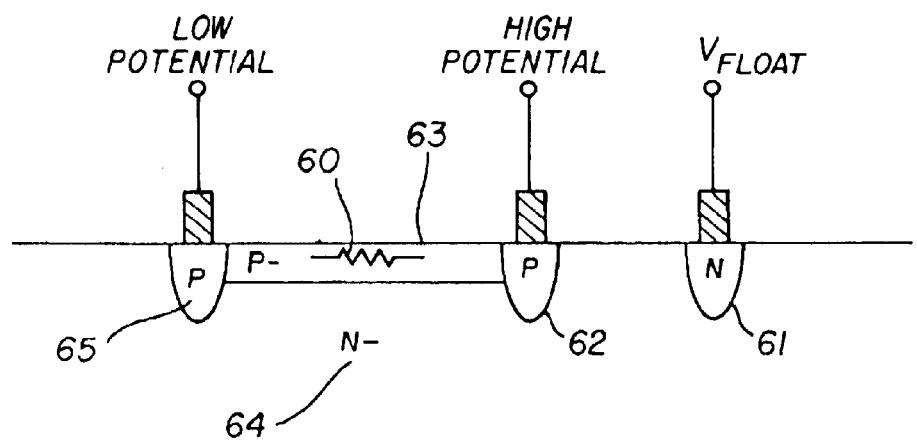
FIG. 6 is a cross sectional view showing the pinch resistance portion with a high breakdown voltage of the level shifter according to the fourth embodiment of the invention.

Now, the level shifter according to a fourth embodiment will be explained hereinafter with reference to FIG. 6. FIG. 6 is a cross sectional view showing the pinch resistance portion with a high breakdown voltage (high-breakdown-voltage pinch resistance portion) of the level shifter according to the fourth embodiment of the invention.

The level shifter according to the fourth embodiment has the same configuration with that of the level shifter according to the second embodiment except the high-breakdown-voltage pinch resistance portion. The level shifter according to the fourth embodiment includes an N-type substrate in substitution for the P-type substrate of the second embodiment. A P-type region 62, a P-type region 65, a $P^-$-type region 63 and an N-type region 61 are formed in the surface portion of the N-type substrate. P-type region 62 is connected electrically to P-type region 65 via $P^-$-type region 63. Pinch resistance with a high breakdown voltage (high-breakdown-voltage pinch resistance) 60 is created in $P^-$-type region 63. P-type region 65 works as a lead out terminal on the low potential side of high-breakdown-voltage pinch resistance 60. P-type region 62 works as a lead out terminal on the high potential side of high-breakdown-voltage pinch resistance 60.

Now, the level shifter according to a fifth embodiment will be explained hereinafter with reference to FIG. 7. The level shifter according to the fifth embodiment has the same configuration with that of the level shifter according to the first embodiment except the structure around the level shift resistor.

Figure 7:
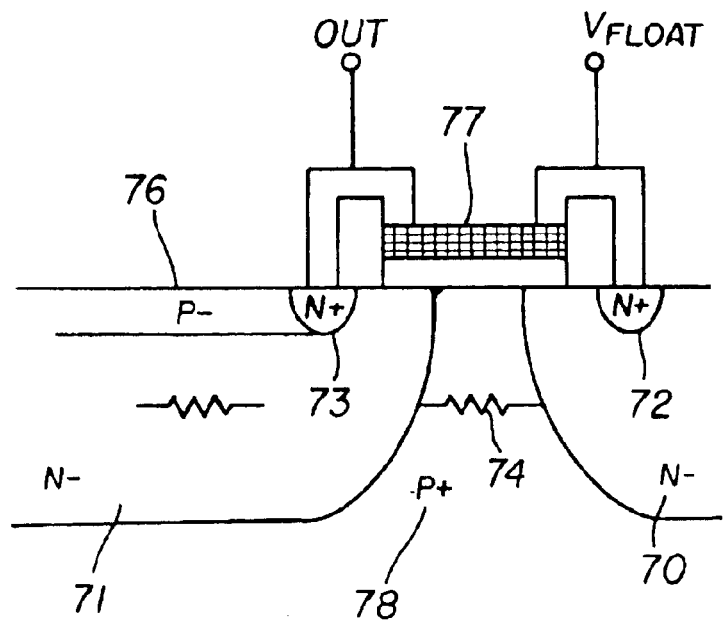
FIG. 7 is a cross sectional view showing the structure around the level shift resistor of the level shifter according to the fifth embodiment of the invention.

FIG. 7 is a cross sectional view showing the structure around the level shift resistor of the level shifter according to the fifth embodiment of the invention. Referring now to FIG. 7, the level shifter according to the fifth embodiment includes a third isolated region 70 added to the structure of the level shifter according to the first embodiment. A second isolated region 71 and third isolated region 70 are formed in the surface portion of a P-type substrate 78. A $P^-$-type region 76 and an $N^+$-type region 73 are formed in the surface portion of second isolated region 71. An $N^+$-type region 72 is formed in the surface portion of third isolated region 70. A level shift resistor 77 is above the extended portion of P-type substrate 78 extended between second isolated region 71 and third isolated region 70. An end of level shift resistor 77 is connected electrically to $N^{-1}$-type region 73 and an OUT terminal. Another end of level shift resistor 77 is connected electrically to $N^+$-type region 72 and a $V_{float}$ potential circuit. Parasitic resistance 74 is created in second isolated region 71, P-type substrate 78 and third isolated region 70 in parallel to level shift resistor 77.

By distributing parasitic resistance 74 into second isolated region, 71 P-type substrate 78 and third isolated region 70 according to the fifth embodiment, the value of parasitic resistance 74 is increased and, therefore, the influence of parasitic resistance 74 on level shift resistor 77 is reduced.

According to the fifth embodiment, second isolated region 71 and third isolated region 70 are isolated form each other completely by P-type substrate 78. Alternatively, second isolated region 71 and third isolated region 70 may be partly connected with each other.

Now, the level shifter according to a sixth embodiment will be explained hereinafter with reference to FIG. 8. The level shifter according to the sixth embodiment has the same configuration with that of the level shifter according to the second embodiment except the structure around the $P^-$-type region that works as a lead out terminal for connecting to the ground.

Figure 8:
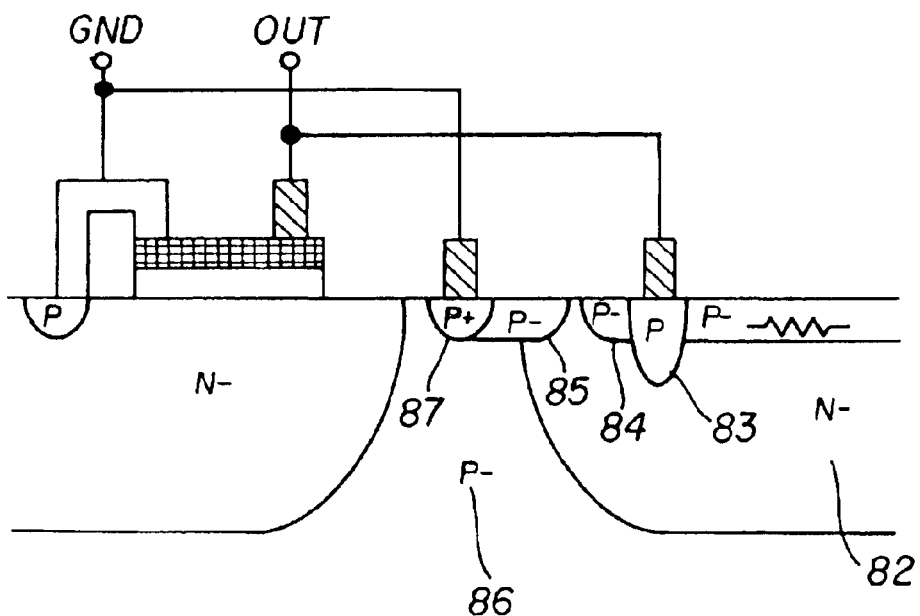
FIG. 8 is a cross sectional view showing the structure around the lead out portion for connecting to the GND terminal of the level shifter according to the sixth embodiment of the invention.

FIG. 8 is a cross sectional view showing the structure around the lead out portion for connecting to the GND terminal of the level shifter according to the sixth embodiment of the invention. Referring now to FIG. 8, a $P^+$-type region 87 for connecting to a GND terminal is in the surface portion of a P-type substrate 86 and a P-type region 83 is in the surface portion of a second isolated region 82. A $P^-$-type region 84 and a $P^-$-type region 85 are interposed between $P^-$-type region 87 and P-type region 83. $P^-$-type region 85 contacts with $P^{-1}$-type region 87, P-type substrate 86 and second isolated region 82. $P^-$-type region 84 contacts with P-type region 83 and second isolated region 82. This configuration facilitates increasing the breakdown voltage. For securing a certain breakdown voltage, it is preferable to connect $P^-$-type region 84 and $P^-$-type region 85 completely. However, $P^-$-type region 84 and $P^-$-type region 85 are spaced apart from each other according to the sixth embodiment to suppress creation of the parasitic resistance caused by connecting $P^-$-type region 84 and $P^-$-type region 85 with each other. Alternatively, $P^-$-type region 84 and $P^-$-type region 85 may be connected partly with each other.

Now, the level shifter according to a seventh embodiment will be explained hereinafter with reference to FIG. 9. The level shifter according to the seventh embodiment includes a second isolated region that integrates second isolated region 8 according to the first embodiment and second isolated region 27 according to the second embodiment.

Figure 9:
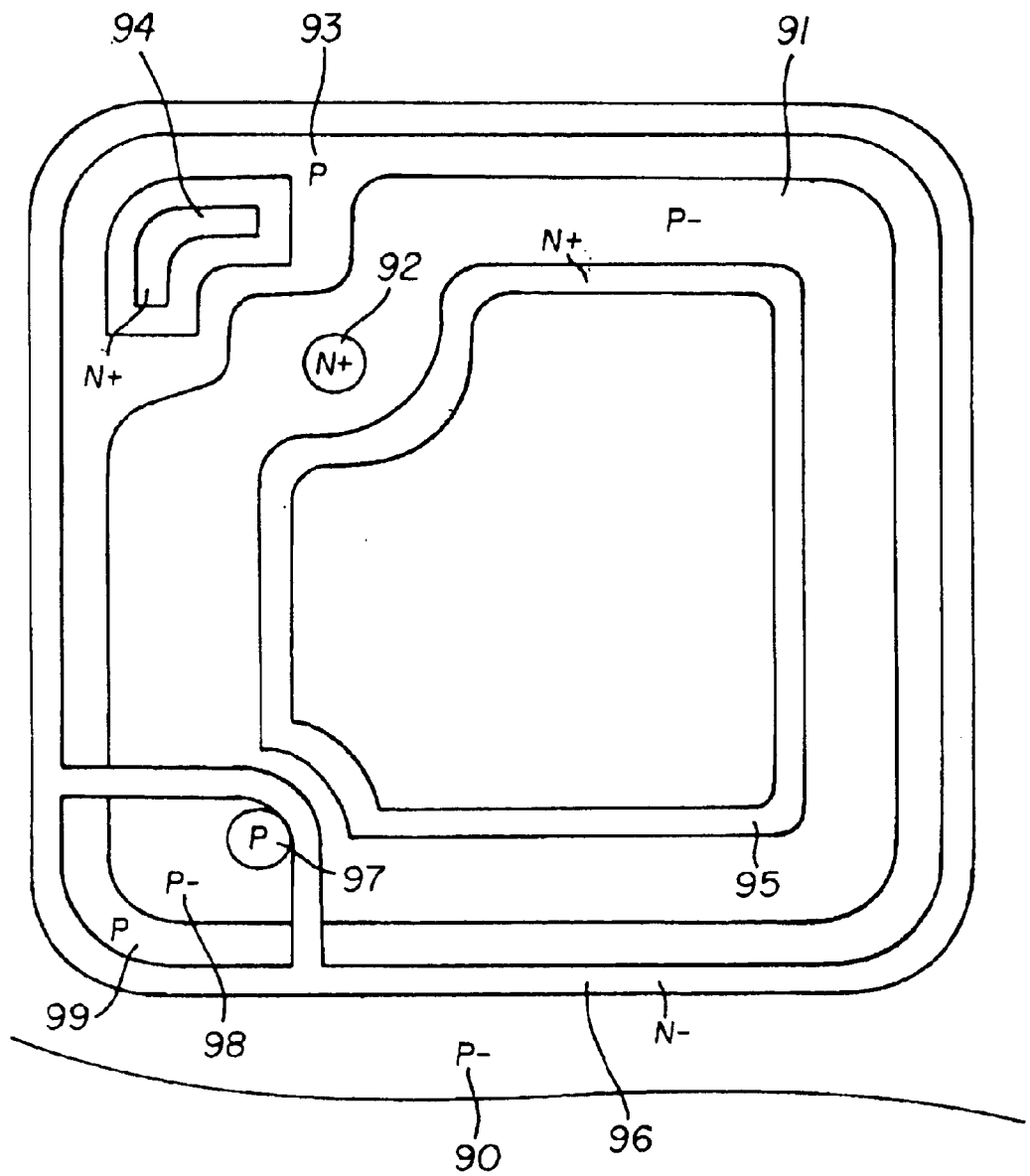
FIG. 9 is a top plan view showing an isolated region of the level shifter according to the seventh embodiment of the invention.
Figure 10:
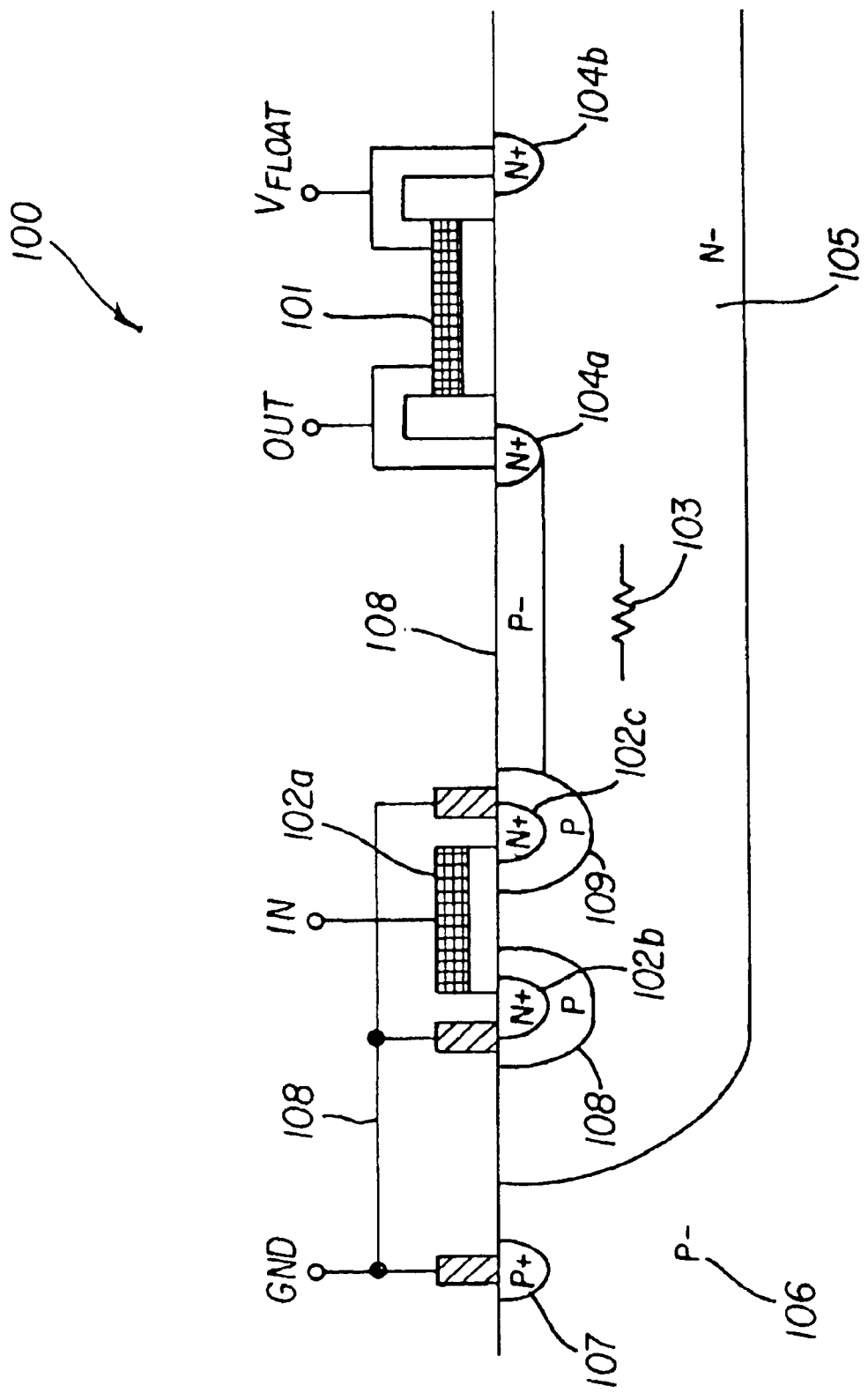
FIG. 10 is a cross sectional view showing the structure of a conventional N-channel level shifter.
Figure 11:
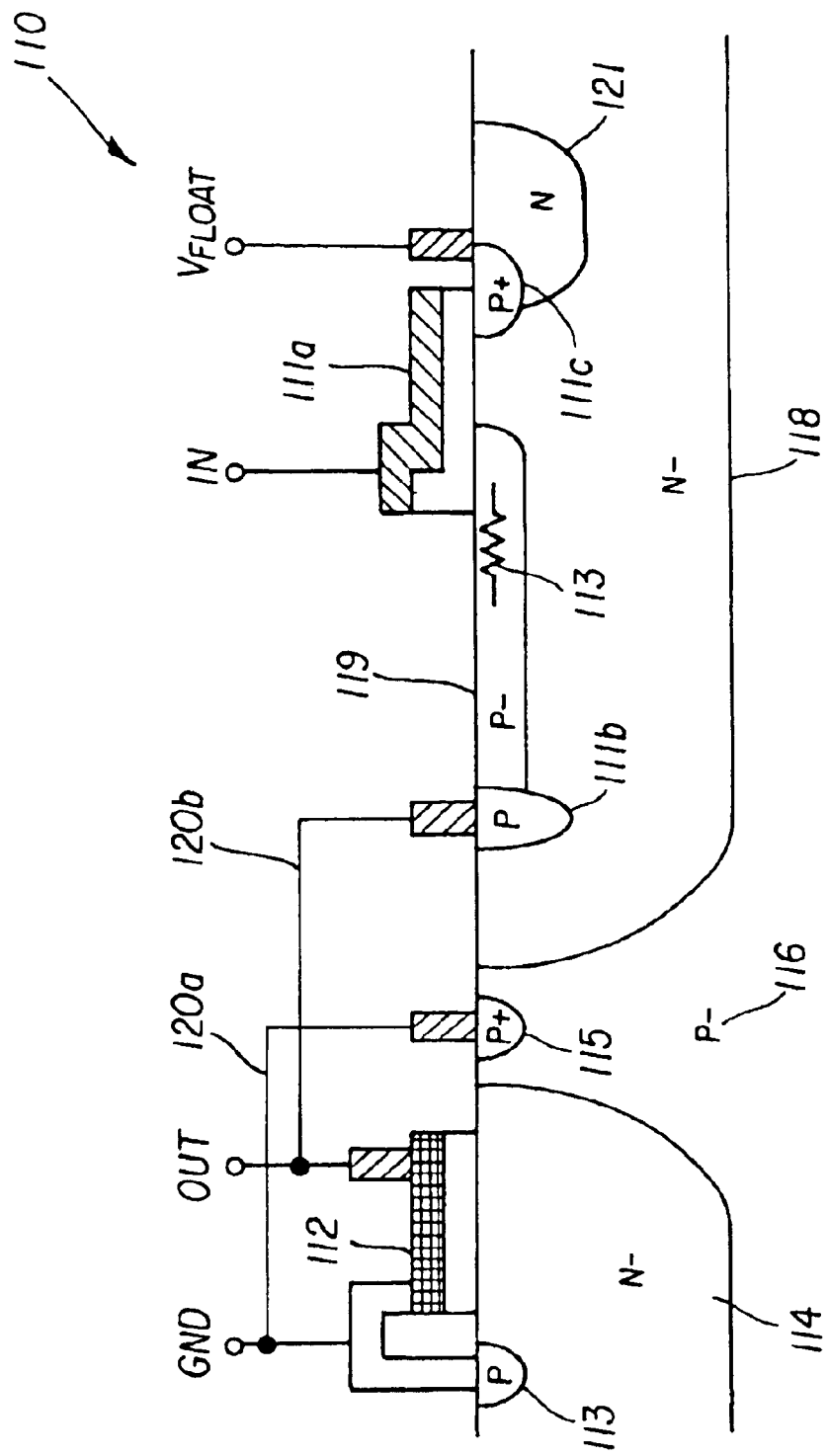
FIG. 11 is a cross sectional view showing the structure of a conventional P-channel level shifter.

FIG. 9 is a top plan view showing an isolated region 96 of the level shifter according to the seventh embodiment of the invention. Referring now to FIG. 9, isolated region 96 is formed in the surface portion of a P-type substrate 90. $P^-$-type regions 91, 98, P-type regions 93, 97, 99, and $N^+$-type regions 92, 94, 95 are formed in the surface portion of isolated region 96. The region including $N^+$-type region 95, P-type region 91, $N^+$-type region 92, P-type region 93 and $N^+$-type region 94 corresponds to second isolated region 8 of level shifter 1 according to the first embodiment shown in FIG. 1. More in detail, $N^+$-type region 95 corresponds to $N^+$-type region 6. $N^+$-type region 92 corresponds to $N^+$-type region 7. $P^-$-type region 91 corresponds to $P^-$-type region 16. P-type region 93 corresponds to P-type regions 9 and 11. And, $N^+$-type region 94 corresponds to $N^+$-type region 10.

The region including N+-type region 95, P-type region 91, P-type regions 97, 99, and P−-type region 98 corresponds to second isolated region 27 of the level shifter according to the second embodiment shown in FIG. 4. More in detail, N+-type region 95 corresponds to N+-type region 25. P-type region 97 corresponds to P-type region 26. P−-type region 98 corresponds to P—type region 33. And, P-type region 99 corresponds to P-type region 28.

Isolated region 96 according to the seventh embodiment is different from second isolated region 8 according to the first embodiment in that P−-type region 91 is interposed between N+-type regions 92 and 95 according to the seventh embodiment. Isolated region 96 according to the seventh embodiment is different from second isolated region 27 according to the second embodiment in that P−-type region 91 is interposed between P-type region 97 and N+-type region 95, and P−-type region 91 and P-type region 97 are separated from each other according to the seventh embodiment. The other local structures are the same with those in the first and second embodiments.

As explained above, the field effect transistor is spaced apart from the high-potential portions, such as a level shift resistor and a pinch resistance with a high breakdown voltage, according to the invention. This specific configuration according to the invention facilitates reducing application of a high bias voltage, influenced by the high-potential portions, to field effect transistor and, therefore, improving the long term reliability of the level shifter.

What is claimed is:

1. A level shifter, formed on a semiconductor substrate, for controlling and driving a power device, the level shifter comprising:
   a level shift resistor connected electrically to an intermediate potential circuit;
   a pinch resistance region exhibiting a high breakdown voltage, the pinch resistance region being connected electrically to the level shift resistor; and
   a field effect transistor region connected electrically to the pinch resistance region, the field effect transistor region being in a region isolated from the level shift resistor and the pinch resistance region.

2. The level shifter according to claim 1, wherein the field effect transistor region is connected to the pinch resistance region by wire bonding.

3. The level shifter according to claim 1, further comprising a protecting means for preventing an over voltage from being applied to the field effect transistor region.

4. The level shifter according to claim 3, wherein the field effect transistor region comprises a drain region, and a source region; and
   wherein the protecting means comprises a protection diode region connected between the drain region and the source region of the field effect transistor region in opposite parallel to the field effect transistor region.

5. The level shifter according to claim 1, the level shifter further comprising:
   a first isolated region in the surface portion of the semiconductor substrate;
   a second isolated region in the surface portion of the semiconductor substrate, the second isolated region including the pinch resistance region with a high breakdown voltage;
   a channel region in the surface portion of the first isolated region;
   a source region in the surface portion of the channel region;
   a drain region in the surface portion of the channel region;
   a gate above the extended portion of the channel region extended between the source region and the drain region; and
   a protection diode region including an anode region in the surface portion of the first isolated region, and a cathode region in the surface portion of the anode region;
   the level shift resistor being arranged above the second isolated region;
   the source region, the drain region, the anode region and the cathode region being connected electrically to the second isolated region by wire bonding.

6. A level shifter, formed on a semiconductor substrate, for controlling and driving a power device, the level shifter comprising:
   a level shift resistor connected electrically to an intermediate potential circuit;
   a pinch resistance region exhibiting a high breakdown voltage, the pinch resistance region being connected electrically to the level shift resistor;
   a field effect transistor region connected electrically to the pinch resistance region, the field effect transistor region being in a location not in contact with the level shift resistor nor with the pinch resistance region;
   a first isolated region in the surface portion of the semiconductor substrate;
   a second isolated region in the surface portion of the semiconductor substrate, the second isolated region including the pinch resistance region with a high breakdown voltage;
   a channel region in the surface portion of the first isolated region;
   a source region in the surface portion of the channel region;
   a drain region in the surface portion of the channel region;
   a gate above the extended portion of the channel region extended between the source region and the drain region;
   a protection diode region including an anode region in the surface portion of the first isolated region, and a cathode region in the surface portion of the anode region; and
   a third isolated region, thereto an end of the level shift resistor is connected electrically, and another end of the level shift resistor being connected electrically to the second isolated region;
   wherein the level shift resistor is arranged above the second isolated region; and
   wherein the source region, the drain region, the anode region and the cathode region are connected electrically to the second isolated region by wire bonding.

7. A level shifter, formed on a semiconductor substrate, for controlling and driving a power device, the level shifter comprising:
   a level shift resistor connected electrically to an intermediate potential circuit;
   a pinch resistance region exhibiting a high breakdown voltage, the pinch resistance region being connected electrically to the level shift resistor;
   a field effect transistor region connected electrically to the pinch resistance region, the field effect transistor region being in a location not in contact with the level shift resistor nor with the pinch resistance region;

a first isolated region in the surface portion of the semiconductor substrate;

a second isolated region in the surface portion of the semiconductor substrate;

a protection diode including an anode region in the surface portion of the second isolated region, and a cathode region in the surface portion of the anode region;

a drain region in the surface portion of the second isolated region;

a source region in the surface portion of the second isolated region; and a gate above the extended portion of the second isolated region extended between the drain region and the source region;

wherein the level shift resistor is arranged above the first isolated region;

wherein the level shift resistor is connected electrically to the pinch resistance region by wire bonding;

wherein the pinch resistance region is in the surface portion of the second isolated region; and wherein the pinch resistance region is connected electrically to the anode region of the protection diode and the drain region by wire bonding.

8. The level shifter according to claim 7, further comprising a first lead out region for connecting to the ground in the surface portion of the semiconductor substrate, a second lead out region for electrically connecting the pinch resistance region to the wire bonding, and a region for sustaining the breakdown voltage between the first lead out region and the second lead out region.

9. A level shifter, formed on a semiconductor substrate, for controlling and driving a power device comprising:

a first level shifter including:
  a first isolated area in the surface portion of the semiconductor substrate;
  a field effect transistor formed in a surface portion of the first isolated area; and
  a second isolated area in the surface portion of the semiconductor substrate having a pinch resistance with a high breakdown voltage; and
  a level shift resistor arranged above the second isolated area; and a second level shifter including:
  a first isolated area in the surface portion of the semiconductor substrate
  a level shift resistor arranged above the first isolated area;
  a second isolated region in the surface portion of the semiconductor substrate having a pinch resistance with a high breakdown voltage; and
  a field effect transistor formed in a surface portion of the second isolated area;

wherein the second isolated area of the first level shifter is possessed commonly by the second isolated area of the second level shifter.

10. A level shifter, formed on a semiconductor substrate, for controlling and driving a power device, the level shifter comprising:

a first isolated region in at least one of the surface portion of the semiconductor substrate and a second semiconductor substrate;

a second isolated region in the surface portion of the semiconductor substrate, the second isolated region including a pinch resistance region with a high breakdown voltage;

a channel region in the surface portion of the first isolated region;

a source region in the surface portion of the channel region;

a drain region in the surface portion of the channel region;

a gate above the extended portion of the channel region extended between the source region and the drain region; and a level shift resistor connected electrically to an intermediate potential circuit, the level shift resistor being arranged above the second isolated region, and the pinch resistance region being connected electrically to the level shift resistor;

wherein the source region and the drain region are connected electrically to the second isolated region by wire bonding.

11. The level shifter according to claim 10, the level shifter further comprising:

a protection diode region including an anode region in the surface portion of the first isolated region, and a cathode region in the surface portion of the anode region;

wherein the anode region and the cathode region are connected electrically to the second isolated region by wire bonding.

12. A level shifter, formed on a semiconductor substrate, for controlling and driving a power device, the level shifter comprising:

a first isolated region in the surface portion of the semiconductor substrate;

a second isolated region in at least one of the surface portion of the semiconductor substrate and a second-semiconductor substrate;

a pinch resistance region exhibiting a high breakdown voltage;

a drain region in the surface portion of the second isolated region;

a source region in the surface portion of the second isolated region; and a gate above the extended portion of the second isolated region extended between the drain region and the source region;

a level shift resistor connected electrically to a ground terminal, the level shift resistor being arranged above the first isolated region, and the pinch resistance region being connected electrically to the level shift resistor;

the level shift resistor being connected electrically to the pinch resistance region by wire bonding;

wherein the pinch resistance region is in the surface portion of the second isolated region;

wherein the pinch resistance region is connected electrically to the drain region by wire bonding.

13. The level shifter according to claim 12, the level shifter further comprising:

a protection diode including an anode region in the surface portion of the second isolated region, and a cathode region in the surface portion of the anode region;

wherein the pinch resistance region is connected electrically to the anode region of the protection diode by wire bonding.

* * * * *